United States Patent [19]

Frederick

[11] Patent Number: 5,178,720
[45] Date of Patent: Jan. 12, 1993

[54] METHOD FOR CONTROLLING OXYGEN CONTENT OF SILICON CRYSTALS USING A COMBINATION OF CUSP MAGNETIC FIELD AND CRYSTAL AND CRUCIBLE ROTATION RATES

[75] Inventor: Roger A. Frederick, St. Louis, Mo.

[73] Assignee: MEMC Electronic Materials, Inc., St. Peters, Mo.

[21] Appl. No.: 744,891

[22] Filed: Aug. 14, 1991

[51] Int. Cl.$^5$ .............................................. C30B 15/06
[52] U.S. Cl. ................................. 156/618.1; 156/601; 156/617.1; 156/619.1; 156/620.4; 156/DIG. 80; 422/249
[58] Field of Search .................. 156/601, 617.1, 618.1, 156/619.1, 620.4, DIG. 80; 422/249

[56] References Cited

U.S. PATENT DOCUMENTS

| | | | |
|---|---|---|---|
| 4,436,577 | 3/1984 | Fiederick et al. | 156/617 |
| 4,592,895 | 6/1986 | Matsutani et al. | 156/601 |
| 4,617,173 | 10/1986 | Latka | 422/249 |
| 4,659,423 | 4/1987 | Kim et al. | 156/617 |
| 4,830,703 | 5/1989 | Matsutani | 422/249 |
| 4,849,188 | 7/1989 | Takasu et al. | 422/249 |

FOREIGN PATENT DOCUMENTS

| | | |
|---|---|---|
| 0285943 | 10/1988 | European Pat. Off. ......... 156/617.1 |
| 58-217493 | 12/1783 | Japan . |
| 60-81086 | 5/1985 | Japan . |
| 61-222984 | 10/1986 | Japan . |
| 64-42385 | 2/1989 | Japan . |
| 1-282185 | 11/1989 | Japan . |
| 2-55284 | 2/1990 | Japan . |
| WP89/08731 | 9/2189 | PCT Int'l Appl. . |

OTHER PUBLICATIONS

Hirata et al., "Silicon Crystal Growth in a Cusp Magnetic Field", Journal of Crystal Growth, 96 (1989) pp. 747-755.

Hirata et al., "Homogeneous Increase in Oxygen Concentration in Czochralski Silicon Crystals By a Cusp Magnetic Field", Journal of Crystal Growth, 98 (1989) pp. 777-781.

R. W. Series, "Effect of a Shaped Magnetic Field on Czochralski Silicon Growth", Journal of Crystal Growth 97 (1989) pp. 92-98.

Primary Examiner—Robert Kunemund
Assistant Examiner—Felisa Garrett
Attorney, Agent, or Firm—Senniger, Powers, Leavitt & Roedel

[57] ABSTRACT

A Czocharalski method for producing silicon rods wherein a single crystal silicon rod is pulled from a silicon melt contained in a coaxial crucible. In the method, the rod and crucible are rotated in opposite directions about their axes, the rotation rate of the rod being greater than the rotation rate of the crucible as the rod is grown. The rotation rate of the crucible is increased as the length of the rod increases. A magnetic field that is substantially rotationally symmetrical about the axis of the rod is imposed upon the silicon melt until a fraction of the silicon melt is solidified, the magnetic field having components which perpendicularly intersect the bottom and side walls of the crucible and a component which perpendicularly intersects the surface of the silicon melt. The average magnetic component which perpendicularly intersects the molten silicon surface is about zero, and the intensity of the magnetic field component which perpendicularly intersects the bottom and side walls of the crucible is decreased as the fraction of silicon melt solidified increases.

20 Claims, 7 Drawing Sheets

METHOD FOR CONTROLLING OXYGEN CONTENT OF SILICON CRYSTALS USING A COMBINATION OF CUSP MAGNETIC FIELD AND CRYSTAL AND CRUCIBLE ROTATION RATES

BACKGROUND OF THE INVENTION

This invention relates to a method for regulating concentration and distribution of oxygen in Czochralski drawn silicon crystal rods through a combination of variation of a cusp magnetic field and variation of the magnitude of crystal and crucible rotation rates.

When a crystal is grown from a molten liquid stored in a container, the constituent materials of the container are partially dissolved in the molten liquid thereby migrating into the product crystal as impurities. At the melt temperature of silicon (about 1420° C.), the surface of the silica ($SiO_2$) crucible which is in contact with the melt dissolves. Some part of the dissolved silica evaporates from the surface of the melt as SiO (silicon monoxide). Another part of dissolved silica is incorporated into the growing crystal. The remainder of the dissolved silica is retained in the molten silicon. Thus, the silica crucible which is used to contain the silicon melt is the source of oxygen which is found in silicon crystals grown by the conventional Czochralski technique.

Oxygen in the silicon crystal may have both favorable and unfavorable effects. In the various heat treatment processes during the manufacture of various electrical devices, the oxygen in the crystal may cause crystal defects such as precipitates, dislocation loops and stacking faults or it may cause electrically active defects resulting in devices with inferior performance characteristics. The solid solution of oxygen in the crystal, however, increases the mechanical strength of silicon wafers and the crystal defects may improve the yield of conforming Products by entrapping contaminants of heavy metals. Accordingly, oxygen content of the silicon crystal is an important factor for product quality which must be carefully controlled in accordance with the requirements for the ultimate application for the silicon wafers.

The oxygen concentration in silicon crystals grown under Czochralski conditions prevalent in the industry in the early 1980s varied along the length of the crystal, for example, being higher at the seed end than in the middle and/or bottom or tang end of the crystal. In addition, there was variation in oxygen concentration along the radius of a cross-sectional slice of the crystal.

Frederick et al. proposed in U.S. Pat. No. 4,436,577 one method for regulating oxygen content and distribution of the oxygen content in silicon crystal rod drawn from the action of a seed crystal on a melt of silicon contained in a silica crucible. According to this method, the distribution of oxygen is controlled by rotating the crystal seed rod as drawn from the melt at a greater rate of rotation and in opposite direction to the rotation of the melt crucible rotation while increasing the crucible rotation rate as the crucible melt level diminishes.

Advances in silicon semiconductor technology in more recent years, however, have resulted in increased diameters of silicon crystals relative to that disclosed in the Frederick et al. patent. Consequently, increased molten charge weights and larger crucible diameters are required. In addition, semiconductor fabrication technology has evolved to require generally lower and more precisely controlled levels of oxygen in silicon wafers cut from the ingots. Accordingly, it has become increasingly difficult to homogenize oxygen content in all desired concentration ranges due to physical constraints imposed by the larger physical parameters which restricts the range of crystal and crucible rotation rates over which stable crystal growth is possible.

As a solution to this increasingly difficult oxygen control problem, attention has been given in recent years to the use of an axially-symmetrical and radial cusped magnetic field This method was suggested in Japanese Kokai Patent No. Sho 58[1983]-217493. According to this method, a pair of coils through which circular currents are permeated in opposing directions are configured above and below the molten liquid. As a result, a radial horizontal magnetic field is formed at the ½ position along the depth of the molten liquid. According to the applicant, the radial cusped magnetic field restrains the flow of the molten liquid, thus stabilizing the melt and preventing contamination from the crucible.

Barraclough et al. have suggested an improvement to the cusp magnetic field method in WO 89/08731 (21.09.89). According to Barraclough et al., the magnetic field should have a component of field parallel to the axis of crystal rotation that is less than 500 gauss at the interface between the growing crystal and melt, with a value above 500 gauss at other parts of the melt and this distribution of magnetic field is maintained during the growth of the crystal.

Hirata et al. have suggested a different improvement in Japanese Kokai Patent No. Hei 1[1989]-282185. According to Hirata et al., migrating impurities such as oxygen are controlled by imposing a cusp magnetic field upon the melt, rotating the crucible and crystal in opposite directions, and rotating the crucible at a rotational speed greater than that of the crystal.

Hirata et al. have suggested yet another improvement in Japanese Kokai Patent No. Hei 2[1990]-55284. According to Hirata et al., migrating impurities such as oxygen are controlled by imposing a cusp magnetic field upon the melt and varying the ratio of the intensity of the magnetic field component which perpendicularly intersects the surface of the molten liquid and the intensity of the magnetic field component which perpendicularly intersects the bottom surface of the molten liquid. This ratio can be varied by (1) moving the coils relative to the crucible (while maintaining the distance between the coils constant), (2) changing the ampere turn ratio between the coils, or (3) changing the distance between the coils.

None of the cusp magnetic field methods proposed to date, however, has been entirely satisfactory. Under certain conditions, crystals grown in cusp magnetic fields exhibit poor axial and radial oxygen uniformity similar to that observed with axial fields. The problem, when experienced, tends to occur in the latter stages of the solidification process possibly as the result of an accumulation of oxygen or oxygen-containing compounds in a stagnation zone near the relatively strong vertically directed magnetic field in that area.

SUMMARY OF THE INVENTION

Among the objects of the present invention, therefore, may be noted the provision of a method for regulating oxygen content and distribution of the oxygen content in silicon crystal rod drawn from the action of a seed crystal on a melt of silicon contained in a silica crucible, the provision of such a process which provides uniform distribution of the oxygen content as well as a desired level of oxygen content, and the provision of such a process which is suitable for use in the preparation of silicon rods having relatively large diameters and relatively low oxygen content.

Briefly, therefore, the present invention is directed to the Czochralski method for producing silicon rods wherein a single crystal silicon rod is pulled from a silicon melt contained in a crucible coaxial with the rod. In the method, the rod and crucible are rotated in opposite directions about their axes, the rotation rate of the rod being greater than the rotation rate of the crucible as the rod is grown. The rotation rate of the crucible is increased as the length of the rod increases. A magnetic field that is substantially rotationally symmetrical about the axis of the rod is imposed upon the silicon melt until a fraction of the silicon melt is solidified, the magnetic field having components which perpendicularly intersect the bottom and side walls of the crucible. As the fraction of silicon melt solidified increases, the intensity of the magnetic field component which Perpendicularly intersects the bottom and side walls of the crucible is decreased.

Other objects will be in part apparent and in part pointed out hereinafter.

DETAILED DESCRIPTION OF THE PREFERRED EMBODIMENTS

Figure 1:
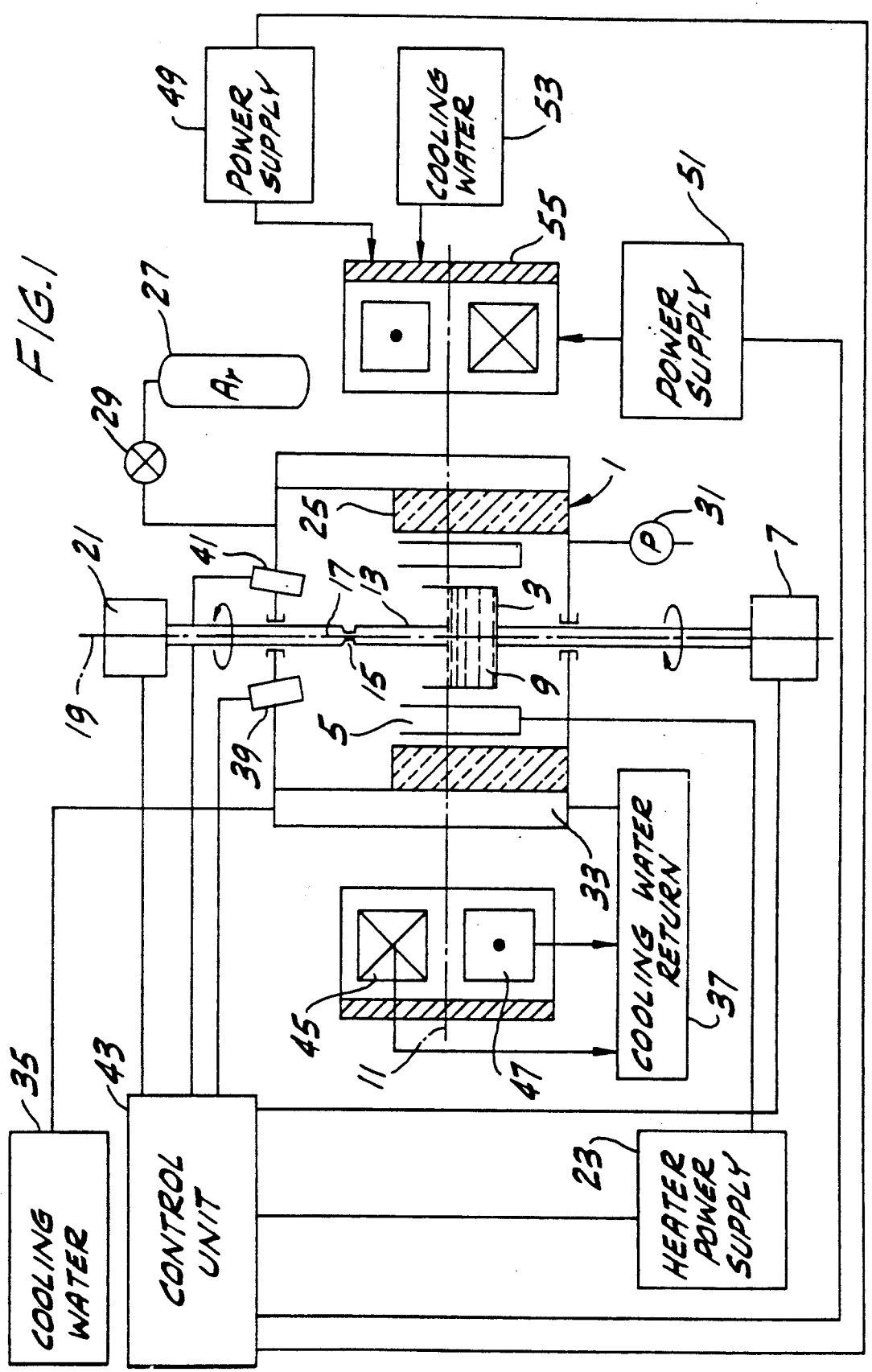
FIG. 1 is a sectional view of a Czochralski crystal growth apparatus according to an embodiment of the present invention.

Referring now to FIG. 1, a Czochralski crystal growth apparatus for use in accordance with the present invention is illustrated. Within vacuum chamber 1 is crucible 3 surrounded by resistance heater 5. Crucible drive unit 7 rotates the crucible in the clockwise direction as indicated by the arrow and raises and lowers the crucible as necessary. Within crucible 3 is silicon melt 9 having melt level 11 and from which single crystal 13 is pulled, starting with seed crystal 15 attached to pull shaft or cable 17. Crucible 3 and single crystal 13 have common axis of symmetry 19. Pull shaft or cable 17 is rotated in the counterclockwise direction and raised and lowered as necessary by crystal drive unit 21. Heater power supply 23 energizes resistance heater 5 and insulation 25 lines the inner wall of the vacuum chamber. Argon gas is fed to vacuum chamber 1 from a bottle 27 via a gas flow controller 29 as gas is removed from the vacuum chamber by vacuum pump 31. Surrounding the vacuum chamber is chamber cooling jacket 33 which is fed with cooling water from a reservoir 35. The cooling water is then drained to cooling water return manifold 37. A photo cell 39 measures the melt surface temperature and diameter transducer 41 measures the diameter of the single crystal 13. Their signals are processed by control unit 43. This control unit may be a programmed digital or analog computer; it controls crucible and single crystal drive units 7 and 21, heater power supply 23, upper and lower coil power supplies 49 and 51, pump 31 and argon flow controller 29.

Surrounding vacuum chamber 1 are upper solenoid coil 45 and lower solenoid coil 47 located above and below, respectively, silicon melt surface 11 and having axes of symmetry 19. The upper and lower coils have separate power supplies: upper coil power supply 49 and lower coil power supply 51, each of which is connected to control unit 43. Current flows in opposite directions in the two solenoids to produce the cusp magnetic field. Cooling water is provided to the upper and lower coils from reservoir 53 and then drained to cooling water return manifold 37. A ferrous shield 55 surrounds upper and lower coils to reduce stray magnetic field and to enhance the strength of the field produced.

To grow a silicon single crystal, a quantity of polysilicon is charged to crucible 3 and an electric current is passed through heater 5 to melt the charge. The silicon melt can also contain certain dopants which are introduced for the purpose of modifying the electrical characteristics of the silicon as known in the art. A seed crystal 15 is lowered to make contact with the melt and then slowly withdrawn from the melt, in an inert atmosphere such as argon, and the silicon solidifies on the seed to produce the growth of a single crystal. A cylindrical single crystal rod 13 is obtained by rotating the crystal at a predetermined rate as it is drawn. The crucible is similarly rotated at a second predetermined rate, but in the opposite direction relative to the rod. The withdrawing rate and power to the heater is initially controlled to cause a neck down of the crystal and then adjusted to cause the diameter of the crystal to increase in a cone shaped manner until a predetermined crystal diameter is reached. The withdrawal rate and heating are then controlled so as to maintain constant diameter until the process approaches an ending. At that point, the withdrawal rate and heating are increased so that the diameter decreases to form a cone portion at the end of the single crystal rod.

After the single crystal 13 reaches the predetermined diameter (for example, 150 mm or 200 mm) the rotation rates of the single crystal and crucible are controlled to regulate the concentration and distribution of oxygen therein, both axially and radially. The rotation rate of the crucible is typically between 1 and 10 rpm, preferably at least about 4 rpm, and the rotation rate of the single crystal is substantially greater than the rotation rate of the crucible, i.e., is typically about 10 to 20 rpm and at least about 5 rpm greater than the rotation rate of the crucible. In addition, to avoid the formation of waves in the molten silicon the rotation rates of the crucible and single crystal are controlled so that their sum does not exceed a predetermined value. The predetermined value is determined empirically for each system and is dependent upon the diameter of the single crystal, the diameter of the crucible and the amount of silicon charged to the crucible. For example, the sum of the crucible and crystal rotation rates in revolutions per minute (rpm) should not exceed about 32 for a 150 mm rod, 350 mm crucible and a 34 kg silicon charge and should not exceed about 25 for a 200 mm rod, 450 mm crucible and a 60 kg charge.

It has previously been found that the amount of oxygen incorporated in the single crystal depends not only on the area of the crucible in contact with the melt, but also on the crucible rotation rate (see U.S. Pat. No. 4,436,577 incorporated herein by reference). In general, the oxygen content of the rod decreases in the axial direction as the fraction of the molten charge solidified increases for given rod and crucible rotation rates. Accordingly, this effect can be overcome at least in part by increasing the crucible rotation rate as the fraction solidified increases. Significantly, however, it has become increasingly difficult to regulate oxygen content in single crystal rods having relatively large diameters and relatively low concentrations of oxygen, e.g., less than about 15 PPMA (ASTM standard F-121-83), by controlling rotation rates alone.

Figure 2:
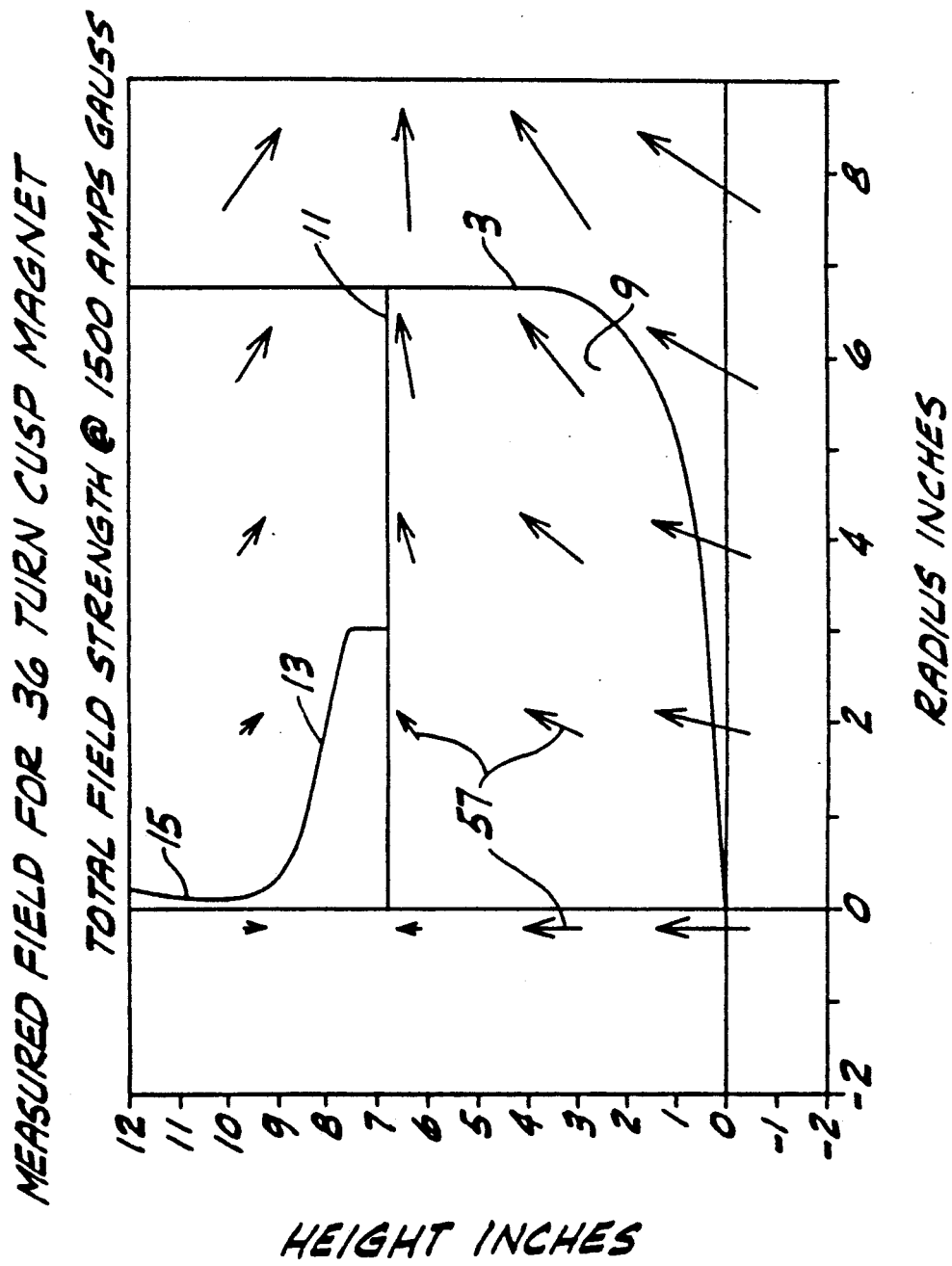
FIG. 2 is an enlarged view of part of FIG. 1 additionally showing a magnetic field generated under one set of conditions (1500 amp) set forth in the Example.

It has been found that oxygen concentration can be more precisely regulated in the axial and radial directions for single crystal rods of relatively large diameter, particularly at relatively low oxygen concentrations, if rotation rates are controlled and a radial cusp magnetic field is imposed upon the silicon melt according to a prescribed program. Referring now to FIGS. 1 and 2, such a program and an apparatus therefor will be described. Current is permeated through the upper and lower coils 45, 47 as indicated (the "." indicating the flow of current out of the page and the "X" indicating the flow of current into the page), thereby causing a magnetic field to be imposed upon crucible 3 and silicon melt 9. The shape of the field is characterized by vectors 57 which have a magnitude in gauss as indicated. The field has horizontal and vertical components which perpendicularly intersect the bottom and side walls of the crucible. In addition, the field may have a vertical component which perpendicularly intersects the silicon melt surface. The average magnetic component which perpendicularly intersects the molten silicon surface, however, is preferably small relative to the average magnetic component perpendicularly intersecting the bottom and side walls of the crucible in contact with the molten silicon, i.e., the average magnetic component which perpendicularly intersects the molten silicon surface is no greater than about one-tenth of the average magnetic component perpendicularly intersecting the bottom and side walls of the crucible in contact with the molten silicon. Most preferably, the average magnetic component perpendicularly intersecting the molten silicon surface is at or near zero, i.e., the magnetic field null plane is located at or near the silicon melt surface. Vertical position, the number of turns and relative current in the two coils 45, 47 may be used to position the null magnetic field at or near the plane of the melt surface 11.

As the crystal pulling process is initiated, current is permeated through coils 45,47 to impose a magnetic field upon the silicon melt and crucible having a predetermined intensity. The predetermined intensity will vary depending upon the diameter of the rod, the diameter of the crucible, the amount of the charge and the desired oxygen content but can readily be determined without undue experimentation. In general, the magnetic field will have a maximum predetermined intensity less than several thousand gauss, and most preferably will have a maximum predetermined intensity between about 400 and 1000 gauss. As the length of the single crystal increases, i.e., as the fraction of the molten charge solidified increases, the intensity of the field is decreased by reducing the amount of current permeated through the coils, moving the coils relative to the crucible or by moving or eliminating magnetic shielding. Preferably, the intensity is decreased by reducing the amount of current permeated through the coils.

As the intensity of the magnetic field is decreased, the magnetic field components which perpendicularly intersect the bottom and side walls of the crucible are decreased. However, because the null plane of the magnetic field is maintained at or near the silicon melt surface, there will not be a significant change in the ratio of the average magnetic field component which perpendicularly intersects the silicon melt surface and the average magnetic field component which perpendicularly intersects the bottom and side walls of the crucible in contact with molten silicon.

Although the intensity of the magnetic field may be adjusted to some value less than its initial level as the length of the single crystal rod increases and the fraction of the molten charge solidified increases, it is preferred that the magnetic field be completely turned off after a predetermined fraction of the molten charge is frozen. Typically, the magnetic field will be turned off after approximately 50% to 80% of the molten charge is frozen. Thereafter, oxygen content is regulated by increasing the crucible rotation rate relative to the single crystal rotation rate.

Depending upon such parameters as single crystal nominal diameter, crucible diameter, charge size and magnetic field characteristics, it may be desirable to increase the strength of the magnetic field imposed on the melt and/or decrease the crucible rotation rate at some point during the run. Such embodiments are contemplated within the scope of the present invention so long as (a) the magnetic field is reduced to some value less than its initial level and (b) the crucible rotation rate is increased relative to the single crystal rotation rate after a fraction of the molten charge is solidified.

As illustrated in the following Example, the process of the present invention may be used to precisely control oxygen concentration in single crystals having relatively low oxygen concentration, i.e., less than 15 PPMA oxygen. These single crystal rods preferably have an oxygen gradient of less than 5% in the radial direction and less than 5% to 10%, most preferably 5% in the axial direction. The Example sets forth one set of conditions that may be used to achieve the desired result. Data similar to FIG. 3 can be generated for other crystal diameters, field strengths, crucible rotation rates, crucible sizes, and silicon charges. A crucible rotation rate and field strength ramping program to produce a desired axial distribution of oxygen can then be deduced, such as in FIG. 10. Accordingly, the Example should not be interpreted in a limiting sense.

The following example illustrates the invention.

EXAMPLE

Single crystal silicon rods (150 mm nominal diameter) were pulled from a 350 mm diameter crucible containing a 34 kg polysilicon charge using the apparatus of FIGS. 1 and 2 (except that the coils were connected in series and energized by a single power source). The rate of rotation of the crystal was between 12 and 24 rpm and the rate of rotation of the crucible was fixed at 4 rpm. For one set of runs, no magnetic field was imposed. In another set of runs, a field resulting from 1.5 kilo amps being passed through each coil in opposite directions, resulting in a field with an average intensity at the silicon to quartz interface of about 400 gauss was imposed as depicted in FIG. 2. In other sets of runs, crucible rotation rate and field strength were varied.

Axial distribution of oxygen in the single crystal silicon rods was determined and the resulting oxygen data was fitted to a model with oxygen being the dependent variable. The independent variables were crystal length, magnetic field (expressed as coil excitation current), and crucible rotation rate. The model is linear with 6 coefficients as follows:

| TERM | COEFFICIENT | VARIABLE - LINEAR | UNITS OF COEFFICIENT |
|---|---|---|---|
| 1 | 15.573 | CONSTANT | PPMA (ASTM F121-83) |
| 2 | −0.118 | LENGTH | PPMA/CM |
| 3 | 0.286 | CRUCIBLE ROTATION | PPMA/RPM |
| 4 | −2.153 | FIELD STRENGTH | PPMA/K AMP |
| 5 | 0.063 | LENGTH/CRUC. ROT. | PPMA*RPM/CM |
| 6 | 0.037 | LENGTH * FIELD | PPMA/CM/K AMP |

Figure 3:
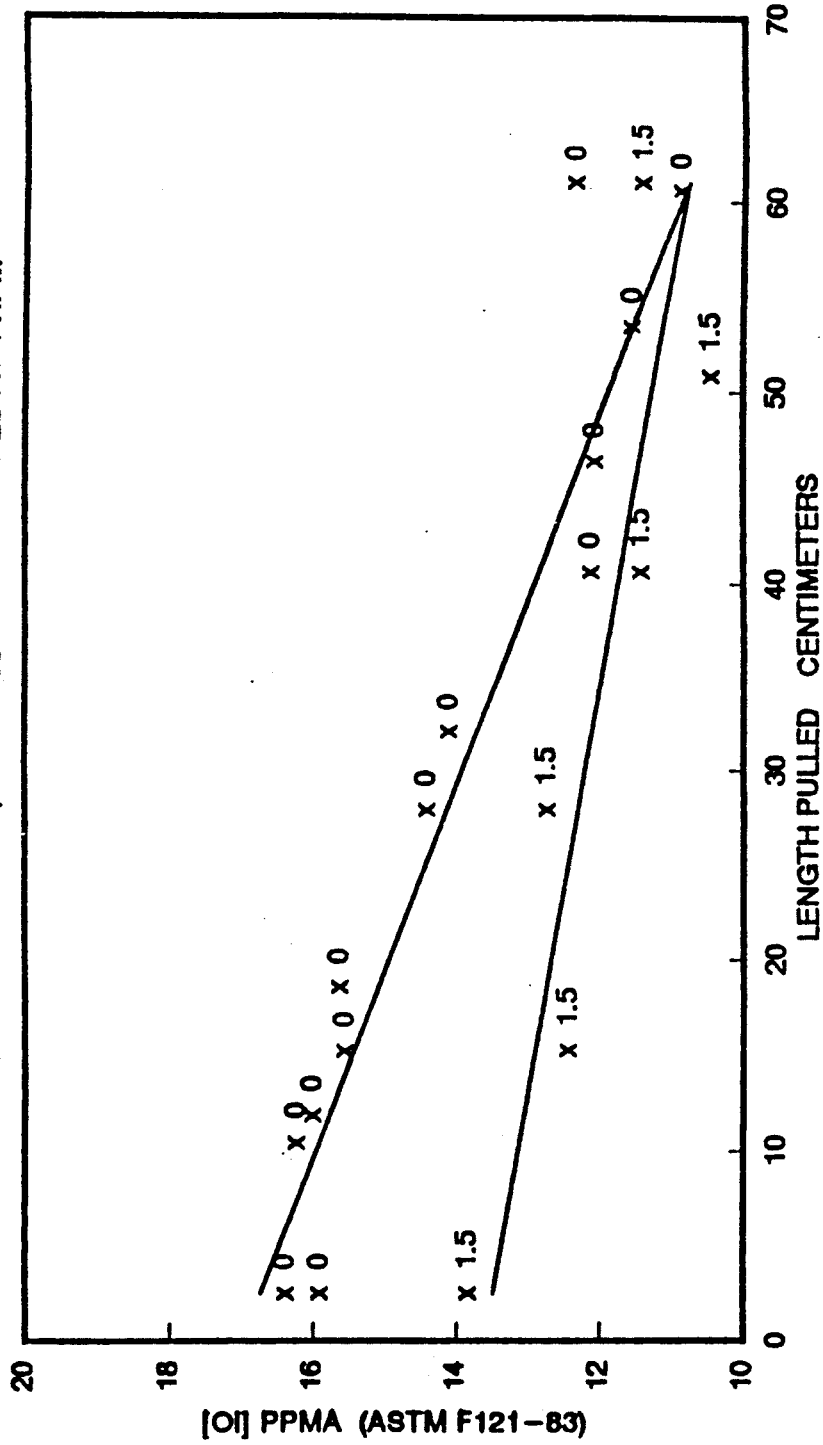
FIG. 3 is a graph showing a linear model for oxygen concentration of a 150 mm silicon crystal rod pulled as set forth in the Example.
Figure 4:
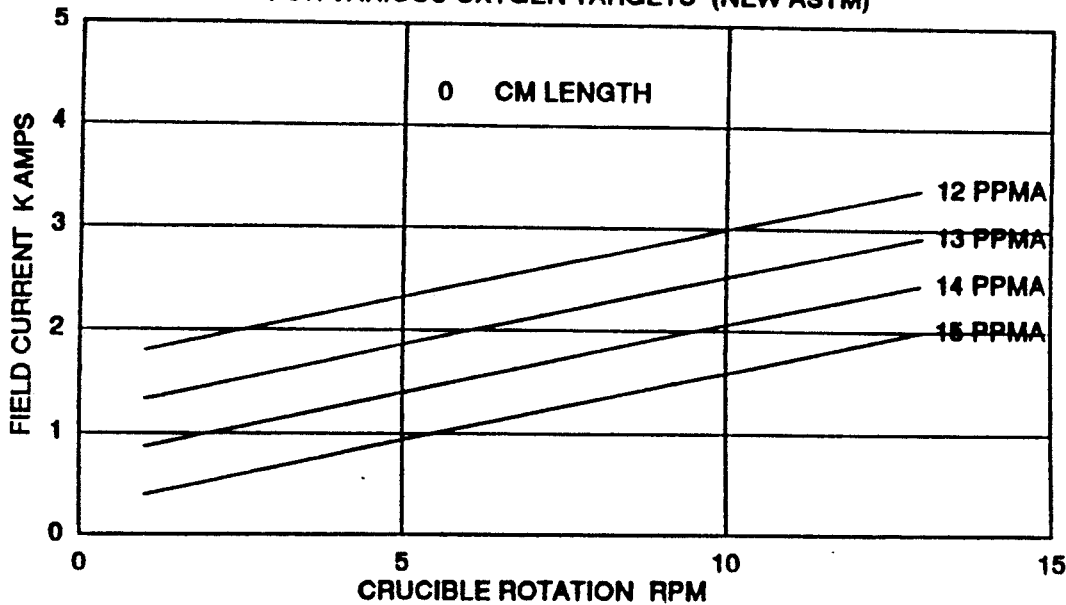
FIGS. 4-9 are graphs showing the combination of field current and crucible rotation rate the model of the Example predicts will result in four different oxygen levels for 6 different lengths of a 150 mm silicon single crystal.
Figure 5:
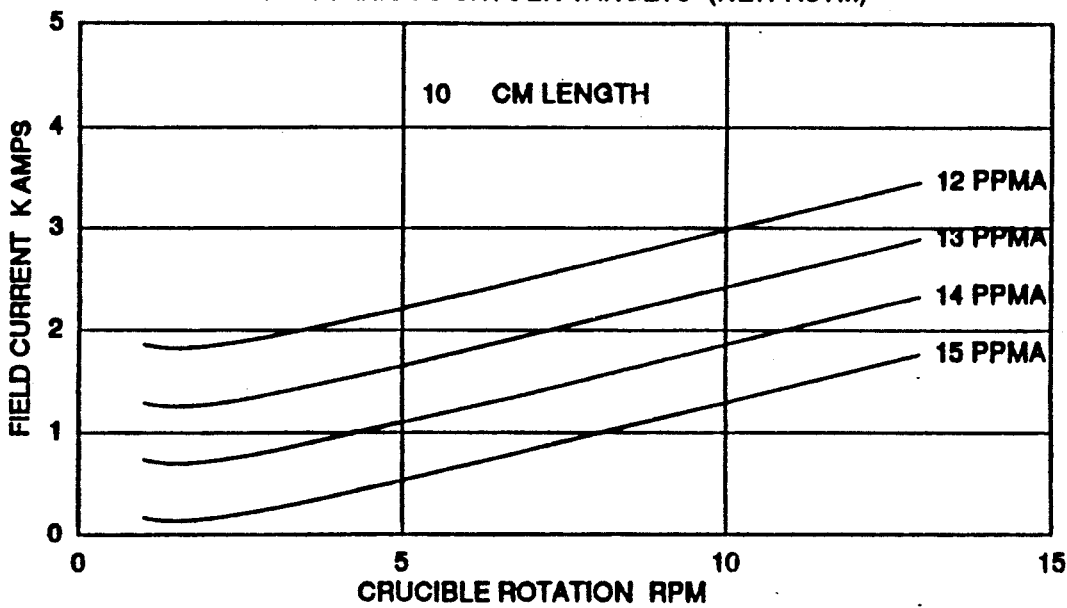
Figure 6:
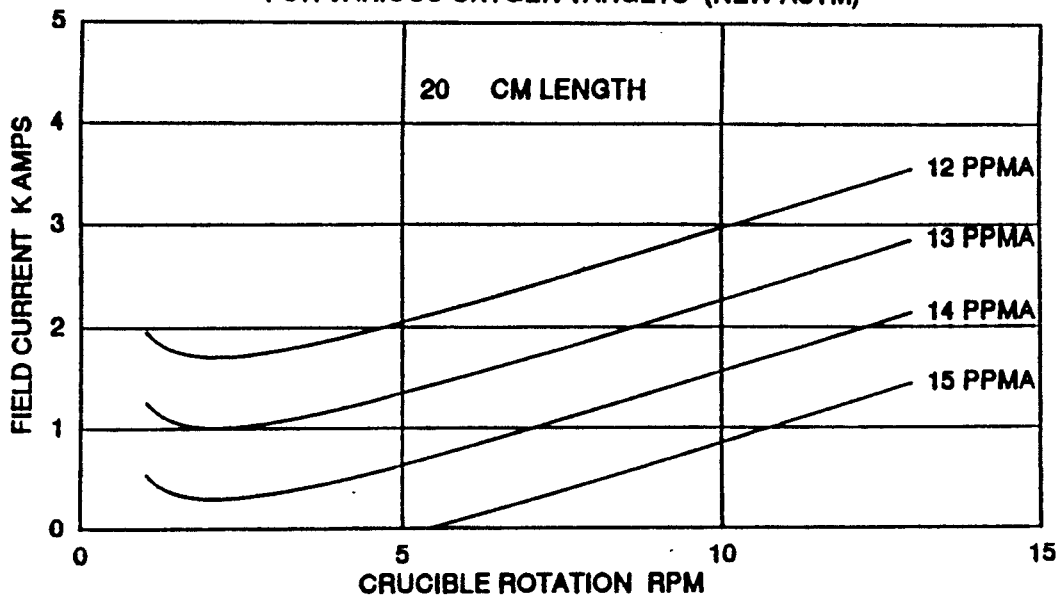
Figure 7:
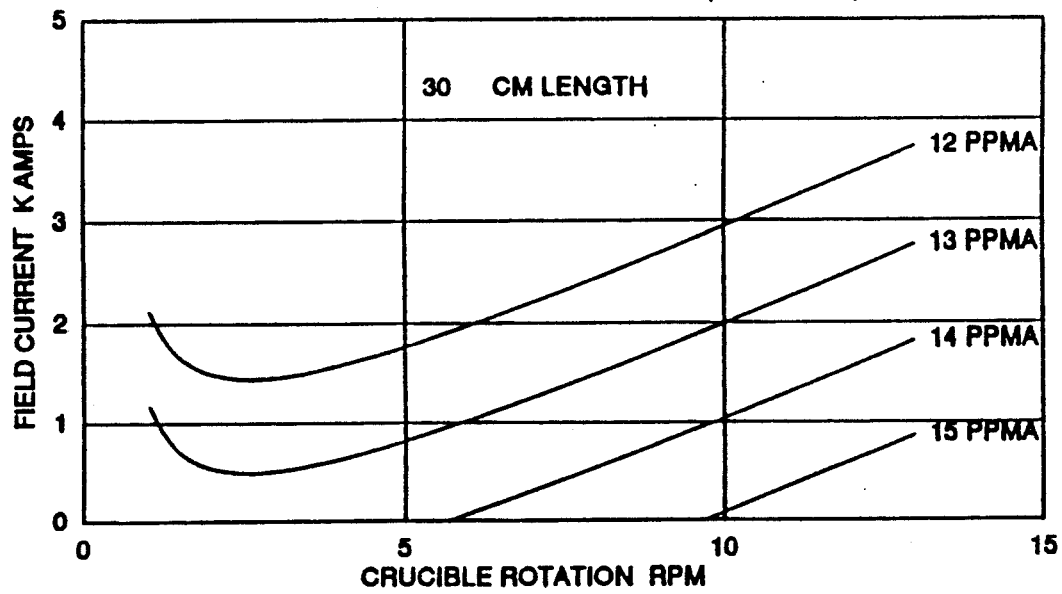
Figure 8:
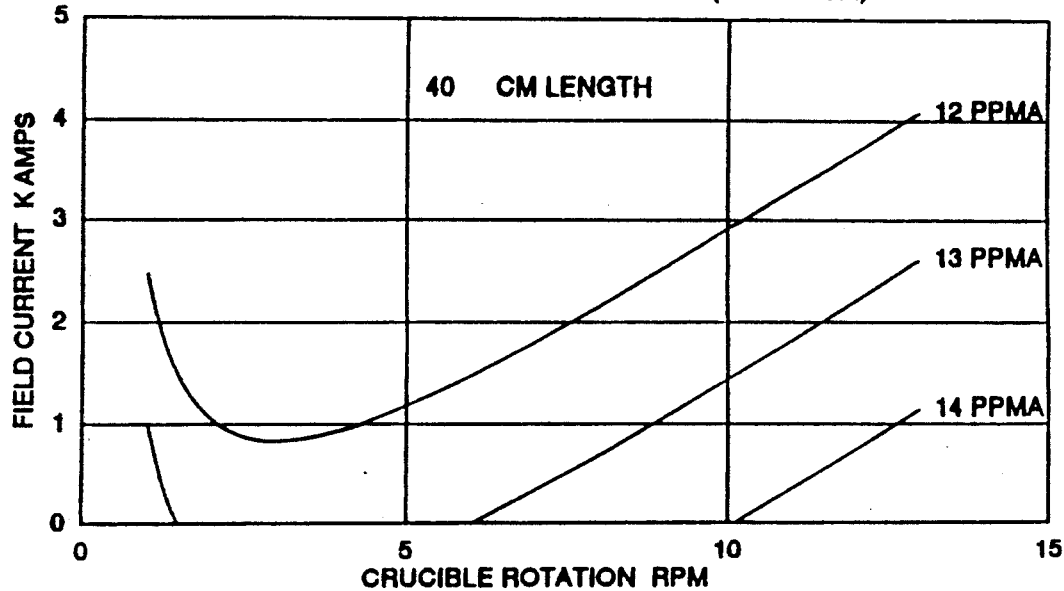
Figure 9:
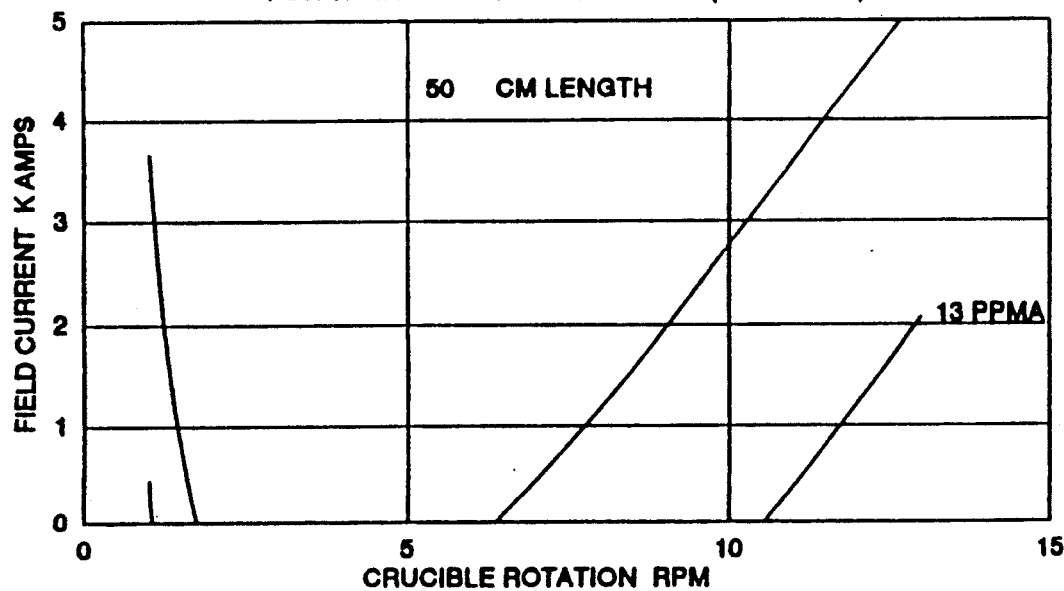

All coefficients are significant to 0.0001 or less and the RMS error is 0.44 PPMA. FIG. 3 shows the fit of the model to the runs.

FIGS. 4-9 show the combination of field current and crucible rotation rate the model predicts will result in four different oxygen levels for 6 different lengths of crystal. Unless indicated otherwise, all oxygen data was measured according to ASTM standard F121-83 and length is in centimeters.

Figure 10:
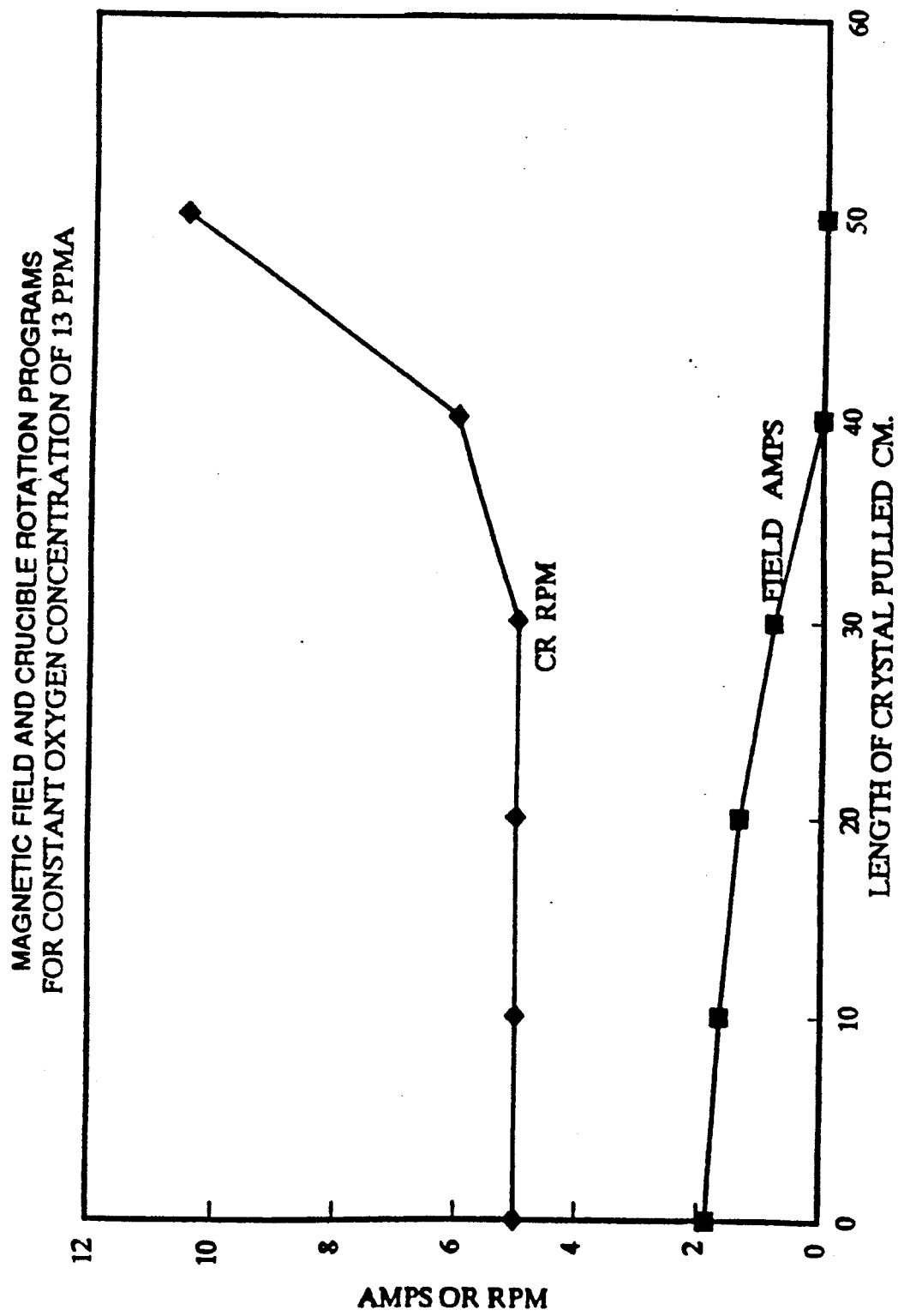
FIG. 10 is a graph showing a program combination of field strength and crucible rotation rate the model of the Example predicts will result in a constant oxygen content of 13 PPMA for a 150 mm silicon single crystal.

FIG. 10 shows a program combination of field strength and crucible rotation rate the model predicts will result in a constant oxygen content of 13 PPMA. According to this program, the crucible rotation is initially set at 5 rpm and a field resulting from about 2 kilo amps being passed through each coil in opposite directions is initially impressed. After 10, 20, 30 and 40 centimeters of the crystal are pulled, respectively, the field strength is decreased as indicated; at 40 centimeters pulled, the field strength is reduced to zero. Simultaneous with the reduction in field strength, the crucible rotation rate is increased from 5 to 6 rpm after 40 centimeters have been pulled and is increased to 10 rpm after 50 centimeters have been pulled.

Data similar to FIG. 10 can be generated for other crystal diameters, field strengths, crucible rotation rates, crucible sizes, and silicon charges. A crucible rotation rate and field strength ramping program to produce a desired axial distribution of oxygen can then be deduced.

In view of the above, it will be seen that the several objects of the invention are achieved and other advantageous results attained.

As various changes could be made in the above methods without departing from the scope of the invention, it is intended that all matter contained in the above description shall be interpreted as illustrative and not in a limiting sense.

What is claimed is:

1. A Czochralski method for producing single crystal silicon rods wherein a single crystal silicon rod is pulled from a silicon melt contained in a crucible, the single crystal silicon rod and the crucible being coaxial, the method comprising:
 rotating the rod and crucible in opposite directions about their axes, the rotation rate of the rod being greater than the rotation rate of the crucible as the rod is grown,
 after the single crystal rod diameter is established, increasing the rotation rate of the crucible as the fraction of silicon melt solidified increases,
 imposing upon the silicon melt a magnetic field that is substantially axially symmetrical about the axis of the rod until a fraction of the silicon melt is solidified, the magnetic field having components which perpendicularly intersect the bottom and side walls of the crucible, the average magnetic field component perpendicularly intersecting the bottom and side walls being greater than an average magnetic field component perpendicularly intersecting the molten silicon surface, and
 decreasing the intensity of the magnetic field components which perpendicularly intersect the bottom and side walls of the crucible as the fraction of silicon melt solidified increases.

2. A method as set forth in claim 1 wherein the magnetic field components which perpendicularly intersect the bottom and side walls of the crucible are decreased to zero after the fraction of silicon melt solidified exceeds about 0.5.

3. A method as set forth in claim 2 wherein the single crystal rotation rate exceed the crucible rotation rate by at least about 5 rpm as the silicon single crystal rod is pulled.

4. A method as set forth in claim 2 wherein single crystal silicon rod has a diameter of about 200 mm and the sum of the crucible and crystal rotation rates in revolution per minute does not exceed about 27.

5. A method as set forth in claim 2 wherein single crystal silicon rod has a diameter of about 150 mm and the sum of the crucible and crystal rotation rates in revolutions per minute does not exceed about 32.

6. A method as set forth in claim 1 wherein the magnetic field components which perpendicularly intersect the bottom and side walls of the crucible are decreased to zero after the fraction of silicon melt solidified exceeds about 0.8.

7. A method as set forth in claim 6 wherein the single crystal rotation rate exceeds the crucible rotation rate by at least about 5 rpm as the silicon single crystal rod is pulled.

8. A method as set forth in claim 1 wherein the average of the magnetic field components which perpendicularly intersect the bottom and side walls of the crucible in contact with the silicon melt is initially at least about 500 gauss.

9. A method as set forth in claim 1 wherein the single crystal silicon rod has a diameter of at least about 200 mm and the sum of the crucible and crystal rotation rates in revolutions per minute does not exceed about 27.

10. A method as set forth in claim 1 wherein single crystal silicon rod has a diameter of about 150 mm and the sum of the crucible and crystal rotation rates in revolutions per minute does not exceed about 32.

11. A method as set forth in claim 1 wherein the single crystal rotation rate exceeds the crucible rotation rate by at least about 5 rpm as the silicon single crystal rod is pulled.

12. A method as set forth in claim 1 wherein the axial oxygen concentration gradient in the rod does not exceed about 5%.

13. A method as set forth in claim 1 wherein the average magnetic field component perpendicular to the silicon melt surface is about zero as the silicon single crystal rod is pulled.

14. A Czochralski method for producing single crystal silicon rods wherein a single crystal silicon rod is pulled from a silicon melt contained in a crucible, the single crystal silicon rod and the crucible being coaxial, the method comprising:
   rotating the rod and crucible in opposite directions about their axes, the rotation rate of the rod being greater than the rotation rate of the crucible as the rod is grown,
   after the single crystal rod diameter is established, increasing the rotation rate of the crucible as the fraction of silicon melt solidified increases,
   imposing upon the silicon melt a magnetic field that is substantially axially symmetrical about the axis of the rod until a fraction of the silicon melt is solidified, the magnetic field having components which perpendicularly intersect the bottom and side walls of the crucible and a component perpendicularly intersecting the molten silicon surface, the average magnetic field component perpendicularly intersecting the molten silicon surface having a value of about zero gauss, and
   decreasing the intensity of the magnetic field components which perpendicularly intersect the bottom and side walls of the crucible as the fraction of silicon melt solidified increases.

15. A method as set forth in claim 14 wherein the single crystal rotation rate exceeds the crucible rotation rate by at least about 5 rpm as the silicon single crystal rod is pulled.

16. A method as set forth in claim 14 wherein the magnetic field components which perpendicularly intersect the bottom and side walls of the crucible are decreased to zero after the fraction of silicon melt solidified exceeds about 0.8

17. A method as set forth in claim 14 wherein the average of the magnetic field components which perpendicularly intersect the bottom and side walls of the crucible in contact with the silicon melt is initially at least about 500 gauss.

18. A Czochralski method for producing single crystal silicon rods wherein a single crystal silicon rod is pulled from a silicon melt contained in a crucible, the single crystal silicon rod and the crucible being coaxial, the method comprising:
   rotating the rod and crucible in opposite directions about their axes, the rotation rate of the rod being greater than the rotation rate of the crucible,
   after the single crystal rod diameter is established, increasing the rotation rate of the crucible as the fraction of the silicon melt solidified increases,
   imposing upon the silicon melt a magnetic field that is substantially axially symmetric about the axis of the rod until a fraction of the silicon melt is solidified, the magnetic field having components which perpendicularly intersect the bottom and side walls of the crucible and a component perpendicularly intersecting the molten silicon surface, the average magnetic field component perpendicularly intersecting the bottom and side walls being greater than an average magnetic field component perpendicularly intersecting the molten silicon surface, and
   decreasing the intensity of the magnetic field after the fraction of silicon melt solidified exceeds about 0.5.

19. A method as set forth in claim 18 wherein the average magnetic field components perpendicularly intersecting the molten silicon surface is about zero.

20. A method as set forth in claim 18 wherein the average of the magnetic field components which perpendicularly intersect the bottom and side walls of the crucible in contact with the silicon melt is initially at least about 500 gauss.

* * * * *